United States Patent
Whiston et al.

(10) Patent No.: US 9,887,687 B2
(45) Date of Patent: Feb. 6, 2018

(54) METHOD OF TRIMMING A COMPONENT AND A COMPONENT TRIMMED BY SUCH A METHOD

(71) Applicant: Analog Devices Global, Hamilton (BM)

(72) Inventors: Seamus Paul Whiston, Raheen (IE); Bernard Patrick Stenson, Limerick (IE); Michael Noel Morrissey, Ballingarry (IE); Michael John Flynn, Waterford (IE)

(73) Assignee: Analog Devices Global, Hamilton (BM)

( * ) Notice: Subject to any disclaimer, the term of this patent is extended or adjusted under 35 U.S.C. 154(b) by 83 days.

(21) Appl. No.: 14/608,072

(22) Filed: Jan. 28, 2015

(65) Prior Publication Data
US 2016/0219719 A1    Jul. 28, 2016

(51) Int. Cl.
*H05K 3/30* (2006.01)
*H05K 1/18* (2006.01)
(Continued)

(52) U.S. Cl.
CPC ............ *H03H 9/462* (2013.01); *H03H 9/174* (2013.01); *H03H 9/22* (2013.01);
(Continued)

(58) Field of Classification Search
CPC ........ H05K 3/30; H05K 1/185; H05K 1/0274; H05K 2201/10022; H03H 9/174;
(Continued)

(56) References Cited

U.S. PATENT DOCUMENTS 2,111,914 A * 3/1938 Kohlberger ............... B41B 1/00
                                                101/401.1
4,435,441 A * 3/1984 Mariani .................... H03H 3/10
                                                310/313 R
(Continued)

FOREIGN PATENT DOCUMENTS

CN       86106280      4/1987
CN      101252346      8/2008
(Continued)

OTHER PUBLICATIONS

Taiwanese Office Action dated Mar. 30, 2017 for Taiwanese Patent Application No. 105100010.
(Continued)

*Primary Examiner* — Nathan Milakovich
(74) *Attorney, Agent, or Firm* — Knobbe, Martens, Olson & Bear, LLP

(57) ABSTRACT

A method of trimming a component is provided in which the component is protected from oxidation or changes in stress after trimming. As part of the method, a protective glass cover is bonded to the surface of a semiconductor substrate prior to trimming (e.g., laser trimming) of a component. This can protect the component from oxidation after trimming, which may change its value or a parameter of the component. It can also protect the component from changes in stress acting on it or on the die adjacent it during packaging, which may also change a value or parameter of the component.

21 Claims, 10 Drawing Sheets

(51) Int. Cl.
   *H03H 9/17* (2006.01)
   *H03H 9/46* (2006.01)
   *H03H 9/22* (2006.01)
   *H03H 9/15* (2006.01)
   *H03H 9/24* (2006.01)
   *H03H 9/02* (2006.01)

(52) U.S. Cl.
   CPC .............. *H03H 2009/02165* (2013.01); *H03H 2009/155* (2013.01); *H03H 2009/2421* (2013.01)

(58) Field of Classification Search
   CPC ........... H03H 9/22; H03H 2009/02165; H03H 2009/2421; H03H 2009/155; H03H 9/462
   See application file for complete search history.

(56) References Cited

U.S. PATENT DOCUMENTS

| | | | | |
|---|---|---|---|---|
| 4,725,480 A * | 2/1988 | Gurol | .............. | H01C 13/02 257/E23.121 |
| 5,138,214 A * | 8/1992 | Nakai | .............. | H03H 3/08 310/312 |
| 5,798,557 A * | 8/1998 | Salatino | .............. | B29C 43/36 257/416 |
| 6,242,792 B1 * | 6/2001 | Miura | .............. | H01L 22/22 257/516 |
| 6,245,590 B1 * | 6/2001 | Wine | .............. | G02B 26/0833 438/14 |
| 6,787,970 B2 * | 9/2004 | Shim | .............. | H03H 9/105 310/312 |
| 7,005,946 B2 * | 2/2006 | Duwel | .............. | H03H 3/02 310/321 |
| 7,170,369 B2 * | 1/2007 | Huang | .............. | H03H 3/0077 310/312 |
| 8,319,404 B2 * | 11/2012 | Takahashi | .............. | H03H 3/04 310/312 |
| 2003/0196489 A1 | 10/2003 | Dwyer | | |
| 2004/0145272 A1 | 7/2004 | Shim et al. | | |
| 2004/0207044 A1 * | 10/2004 | Ruggerio | .............. | H01C 17/242 257/536 |
| 2006/0006964 A1 | 1/2006 | Huang et al. | | |
| 2006/0164710 A1 | 7/2006 | Fujii et al. | | |
| 2007/0063813 A1 * | 3/2007 | McGuinness | .............. | H01C 7/006 338/195 |
| 2008/0129143 A1 * | 6/2008 | Cook | .............. | G01D 18/00 310/312 |
| 2009/0027280 A1 * | 1/2009 | Frangioni | .............. | A61K 49/0032 343/703 |
| 2010/0150612 A1 | 6/2010 | Torashima et al. | | |
| 2011/0068880 A1 | 3/2011 | Ho | | |
| 2011/0169584 A1 * | 7/2011 | Fukuda | .............. | H03H 9/1021 331/158 |
| 2011/0235678 A1 * | 9/2011 | Kurtz | .............. | G01K 7/183 374/185 |
| 2011/0291529 A1 * | 12/2011 | Numata | .............. | C03B 33/033 310/348 |
| 2012/0098593 A1 * | 4/2012 | Downey | .............. | H01C 17/22 327/567 |
| 2012/0142136 A1 * | 6/2012 | Horning | .............. | B81C 1/00301 438/51 |
| 2012/0223622 A1 * | 9/2012 | Otsuki | .............. | H03H 9/02 310/344 |
| 2013/0205898 A1 * | 8/2013 | Nakagawa | .............. | G01C 19/5621 73/504.16 |
| 2015/0158114 A1 * | 6/2015 | Stenson | .............. | H01G 4/33 327/565 |
| 2015/0188515 A1 * | 7/2015 | Yamada | .............. | H03B 5/32 331/156 |
| 2015/0334845 A1 * | 11/2015 | Niino | .............. | H01L 23/26 361/761 |

FOREIGN PATENT DOCUMENTS

| | | | |
|---|---|---|---|
| CN | 102655143 | | 9/2012 |
| CN | 102739189 | | 10/2012 |
| CN | 104753494 | | 7/2015 |
| JP | 60180174 A | * | 9/1985 |
| JP | 2003133879 | | 5/2003 |
| JP | 2005026620 A | * | 1/2005 |
| JP | 2006229877 A | * | 8/2006 |
| JP | 2008066921 A | * | 3/2008 |
| JP | 2013003187 | | 1/2013 |

OTHER PUBLICATIONS

Chinese Office Action dated Dec. 16, 2016 for Chinese Patent Application No. 201610055391.6.
Chinese Office Action dated Sep. 7, 2017 for Chinese Patent Application No. 201610055391.6.
German Office Action dated Sep. 18, 2017 for German Patent Application No. 10 2016 100 821.4.

* cited by examiner

METHOD OF TRIMMING A COMPONENT AND A COMPONENT TRIMMED BY SUCH A METHOD

BACKGROUND

Technical Field

This disclosure relates to a method of trimming an electronic or microelectronic mechanical component to set its value or some other parameter to within a desired range of values, and to components trimmed by this method.

Description of the Related Technology

The processing steps used in the formation of integrated circuits, or of microelectrical mechanical components (MEMS) using integrated circuit fabrication techniques, can suffer from variations from one wafer to the next, or variations from one component to another across a wafer. Such variations may result in relatively small changes to the width of components formed by the microfabrication techniques, or change the relative alignment between different structures within a component. Similarly doping levels may vary from wafer to wafer.

As a result of these variations, the absolute values of components, such as the resistance of a resistor, or the mass of a resonant structure, such as a suspended beam or other component, may vary from integrated circuit to integrated circuit. This variation can occur even when the integrated circuits are supposed to be notionally identical.

The designers of integrated circuits and microelectromechanical systems devices (MEMS) often seek to rely on relative differences between components to make the circuit or structure work rather than relying on the absolute value of a component. Such a technique makes the circuits or MEMS devices relatively insensitive to process variations.

However, occasions still arise where a component should have a known and predetermined value or parameter. In such circumstances, it is known to trim components, for example by laser trimming, to set the required parameter of the component to a desired value give or take an acceptable margin of tolerance. However, trimming a component at a probe stage may still subject the integrated circuits to variation. For example, the absolute value of a parameter of a trimmed component (such as its resistance) may vary post trimming because the wafer is not hermetically sealed until it is packaged. Furthermore the act of packaging the semiconductor die may subject it to stresses that vary the parameter of the trimmed component.

SUMMARY OF CERTAIN INVENTIVE ASPECTS

Disclosed herein is a method of trimming a component where the component is placed in a protected environment prior to trimming. The protected environment may be formed by bonding a cover over and around the component. The component may be formed on a substrate, and the cover may be bonded to the substrate, either directly or by way of an intervening structure that forms a wall. The wall may be fabricated to extend from the substrate using semiconductor fabrication techniques, and hence can be considered to be part of the substrate.

Preferably the bonding technique is chosen such that the substrate and cover form a gas and moisture impermeable seal around the component. The atmosphere around the component may be modified or removed prior to the pending processing so as to inhibit changes to the component, such as formations of oxide thereon, which may change its electrical or physical properties after trimming. Thus, such a component is protected from environmental factors that may contribute to changing its value, and such environmental factors are excluded prior to the trimming operation commencing.

The cover may be formed of a material, such as glass, which is transparent, or substantially transparent to wavelengths of laser light used to trim the component. Glass is advantageous as its coefficient of thermal expansion is similar to that of silicon oxide used in microcircuit fabrication The cover by virtue of being bonded to the substrate or to structures extending therefrom prior to trimming provides additional structural rigidity and/or strength to the substrate at least in the vicinity of the component. This can help to protect the trimmed component from changes and forces or stresses within the component or the substrate during the trimming process, or during subsequent processes such as sawing up a wafer in order to release individual integrated circuits and/or packaging or encapsulating those circuits within, for example, plastic packages commonly used in the formation of integrated circuits.

In accordance with an aspect of this disclosure, there is provided a method of trimming a component formed on a substrate, the method comprising bonding a glass cover to the substrate, or to structures extending from the surface thereof, so as to provide a protected volume around the component, and laser trimming the component to adjust a parameter of the component.

In accordance with a second aspect, of this disclosure there is provided a microelectronic circuit comprising at least a first component formed on a substrate, and where the first component has a parameter that varies as a function of the fabrication process changes used in the formation of the microelectronic circuit, and where the microelectronic circuit comprises a glass cover bonded to the substrate so as to form a hermetically sealed enclosure around the first component prior to trimming said component.

BRIEF DESCRIPTION OF THE DRAWINGS

Devices and methods constituting embodiments of this disclosure will now be described, by way of non-limiting example only, with reference to the accompanying drawings, in which:

FIG. 5a is a perspective view of a resonator that is arranged to facilitate trimming and FIG. 5b is a plan view of the resonator of FIG. 5a;

DETAILED DESCRIPTION OF CERTAIN EMBODIMENTS

As used herein descriptive terms such as "above", "below", "to the side of", "left of" and so on refer to the relative positions of features shown in the Figures and are not to be construed as limiting in respect of any embodiments of this disclosure.

As noted before, it is known to trim components that have been fabricated using techniques associated with the formation of microelectronic circuits, such techniques including deposition of materials, masking and etching processes. Whilst these techniques can be carried out with high precision and accuracy, process variations can still result in variations in components formed by the same processing steps at the same fabrication facility. For example, resistance of a resistor may easily vary by 5% from wafer to wafer.

Integrated circuit designers normally take care to make sure that knowledge of absolute values of a component are not generally required and instead circuits often work on the ratio of component values to one another rather that the absolute value of a component. However, in certain instances, a component is desired to be formed to lie within a predetermined range of values, and in such circumstances trimming of the component is appropriate. However, trimming a component to a desired accuracy whilst on the wafer and preceding any further processing or packaging steps may not give the desired result by the time that component is packaged.

A different technique for protecting components during and after trimming would be advantageous.

Figure 1:
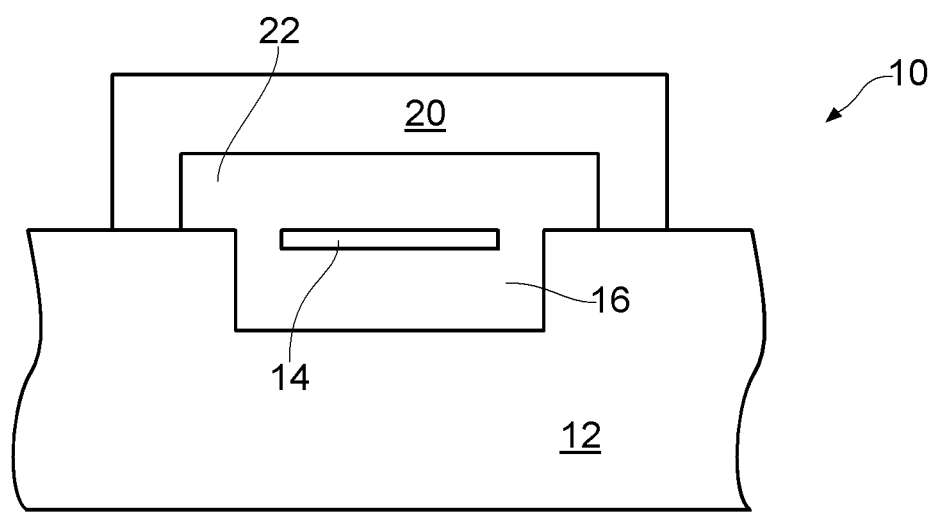
FIG. 1 is a schematic cross section through a MEMS component constituting an embodiment of this disclosure.

FIG. 1 is a cross section of a component, generally indicated 10, formed using microelectronic fabrication techniques. In this example, the component 10 comprises a substrate 12, which carries an element 14 for which trimming may be desirable.

The element 14 may, for example, be a MEMS component which is suspended over a recess 16 formed in the substrate 12. The element 14 may be attached to the substrate 12 by one or more supports (not shown in FIG. 1) extending above and below the plane of FIG. 1 so as to interconnect the element 14 with the substrate 12.

The element 14 may be formed as a beam supported at either end, or as a cantilever. The element 14 may be driven into resonance. The element 14 may be driven into resonance using a variety of techniques. For example, if deflection of the beam is desired, then one side of the beam may be preferentially heated by a pulsed laser, where the pulses occur at the resonance frequency. In some other approaches, the beam may be excited by a mechanical force applied to it, for example, via capacitive coupling. In some other variations, the beam may be associated with a piezoelectric material or magnetostrictive material. Application of appropriate voltages or magnetic fields can apply forces to the beam in order to bring it into resonance. In some embodiments, the beam may form part of a sensor, and the resonant frequency may vary in response to external parameters such as temperature, pressure, or material bonding to the beam. In some other embodiments, the beam may be set to resonate at a nominally constant frequency, substantially independent of external parameters such as temperature in order to form an oscillator or part of a filter circuit. Thus, it may be desirable to be able to set a resonant frequency of the element 14 to a desired frequency, or frequency range, under known conditions. In such circumstances, the element 14 may be subjected to trimming in order to remove mass from selected parts of it or to induce a thermally promoted change in one or more materials constituting the element 14 or part thereof.

In the arrangement shown in FIG. 1, the element 14 is covered by a cap 20 which has a recess 22 formed therein such that, when the cap 20 is correctly positioned with respect to the substrate 12, the recesses 16 and 22 align and cooperate to form a cavity which surrounds the element 14. The cavity is bounded by the substrate 12 and the cap 20.

At least one of the cap 20 and the substrate 12 is made of a material which is transparent to a laser light beam used to trim the element 14.

In embodiments of this disclosure, the cap may, for example, be made of a laser-transparent material, such as glass, and the substrate may be a semiconductor, such as doped silicon. However, other materials exist for use as the laser transparent cover and the substrate. For example both the cover and the substrate may be formed of glass. As illustrated, the cap 20 is attached, for example by being bonded, to the substrate. In some embodiments of this disclosure the shape of the cap, the shape of the surface of the substrate and the bonding method may be selected so as to form a gas and moisture impermeable seal, i.e., a hermetic seal. Suitable bonding processes known to the person skilled in the art include glass frit bonding or semiconductor-metal eutectic bonding, such as silicon-gold bonding where a gold layer can be formed over the substrate and/or the cap in the bond region between the cap 20 and the substrate 12. The cap 20 and the substrate 12 are subsequently bought into contact and heated to the eutectic temperature. The gold and a small quantity of the silicon form a eutectic mix, which can then seal the glass cap to the substrate 12. Once the eutectic is allowed to cool below its eutectic temperature, it solidifies bonding the cap 20 to the substrate 12.

The atmosphere inside the cavity may be controlled by performing the bonding process in a suitable environment, such as in a vacuum. Alternative environments include dry and non-oxidizing gases. The removal of oxygen and moisture from the cavity reduces the risk that further oxidation of the component could occur post trimming, and thereby change its mass or other properties.

Thus if the element 14 is trimmed in a controlled atmosphere (including a vacuum) inside of the cavity, then:
a) no further oxidation should occur after the trim has been completed, and hence drift from the trimmed value can be significantly reduced; and
b) bonding the cover to the substrate prior to trimming can mechanically stabilize the substrate in the vicinity of the element 14 and thereby reduce subsequent changes resulting from forces or changes in forces acting after trimming. Thus drift in the component values that might occur during packaging within, for example, a plastic package filled with bonding material can be much reduced.

Thus, post trim drift can be significantly reduced by capping the element 14 prior to trimming it.

Figure 2:
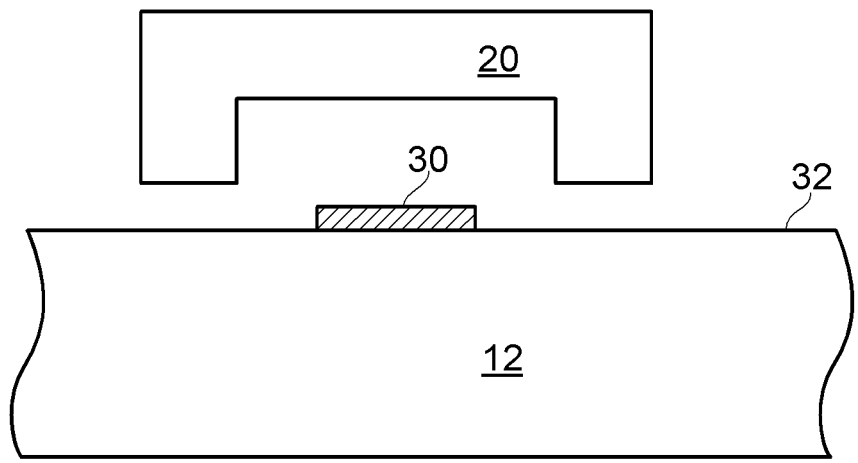
FIG. 2 shows a substrate and cap prior to bonding.
Figure 3:
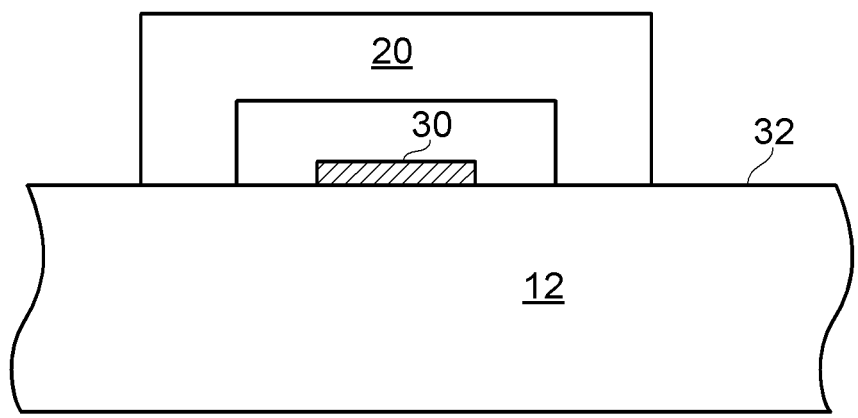
FIG. 3 shows the substrate and cap of FIG. 2 when bonded together.
Figure 4:
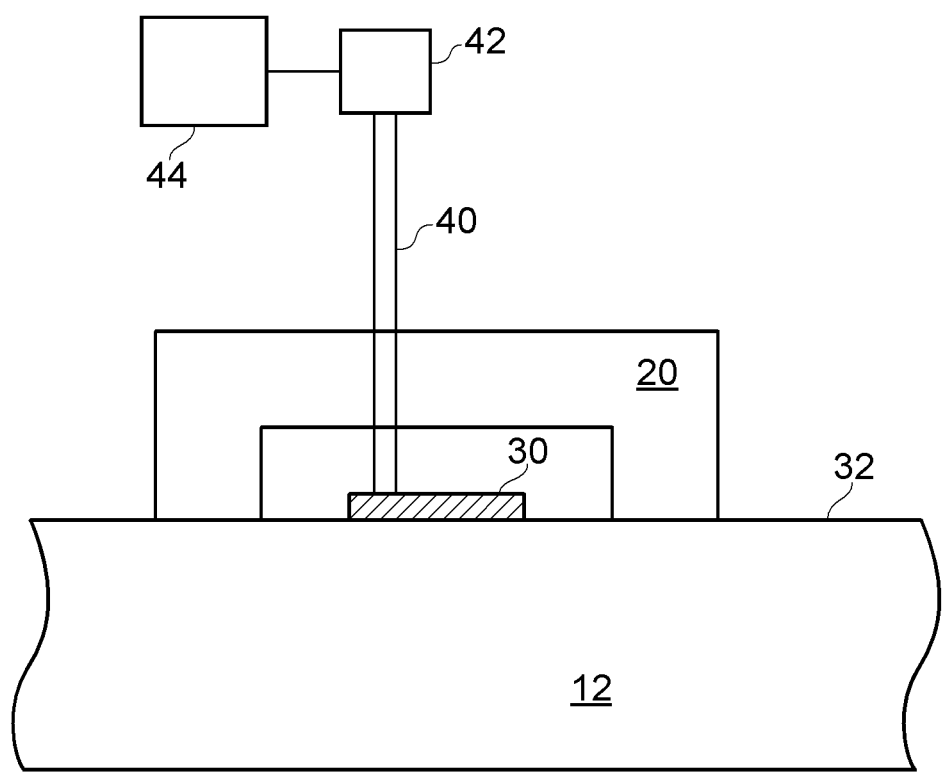
FIG. 4 shows a trimming operation being applied to the combination of the substrate and cap.

FIGS. 2 to 4 sequentially show stages of the bonding and trimming process. In these figures, the trimmable element is designated 30 and rather than being formed within a recess 16 in the substrate 12, the trimmable element 30 is formed above the substrate 12. The substrate 12 may have other components formed within it, such as various transistors and metallic interconnections formed adjacent but beneath an upper surface 32 of the substrate 12. The upper surface 32 may be covered with a layer of passivating material, such as silicon dioxide, upon which the trimmable component 30 has been formed. The trimmable component may be a thin film or thick film component, such as a resistor, an inductor, a capacitor, or a combination of one or more of these components. Other components might include magnetic sensors, such as magneto resistors, where trimming of the component values may be desirable. As shown in FIG. 2, in a first stage of the capping and the trimming process the cap 20 is brought into spatial registration with the substrate 12. The substrate 12 may comprises a wafer of several inches diameter with a relatively large number of individual integrated circuits formed upon it. Similarly, the cap 20 may be formed on or as part of a correspondingly sized glass wafer. In such circumstances, the individual caps may be subcomponents within the glass wafer which has been etched so as to leave a relatively thin supporting layer interconnecting the various individual caps 20 to allow them to be brought into correct spatial registration with corresponding components on the silicon wafer 12. The wafer may be processed to form walls around the trimmable element. This can be used to reduce the depth of the recess in the cap 20, and may allow a planar cap to be used.

Then, as shown in FIG. 3, the cap 20 and the substrate 12 are brought into contact and are bonded together using a suitable bonding process of which several are known to the person skilled in the art.

Following successful completion of the bonding process, a value of the component 30 may be measured or otherwise probed, or a physical property, such as the resonant frequency of the component 30 may be measured, and then the component 30 may be trimmed. Trimming can be performed by selectively illuminating parts of the component 30 with a relatively small diameter laser light beam 40 produced by a suitable laser light source 42 under the command of a controller 44. Such an arrangement is shown in FIG. 4.

Figure 5A:
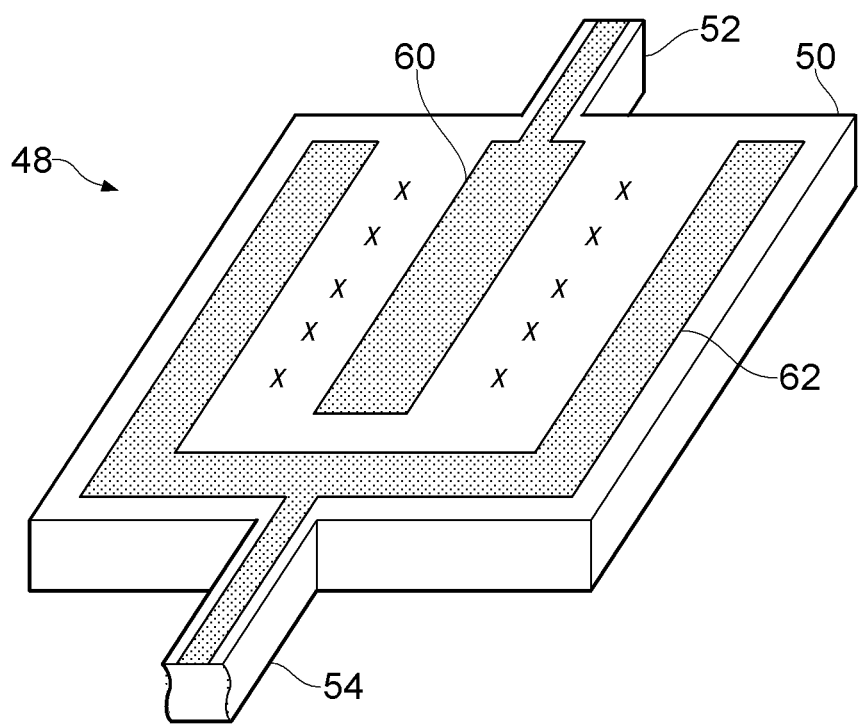
Figure 5B:
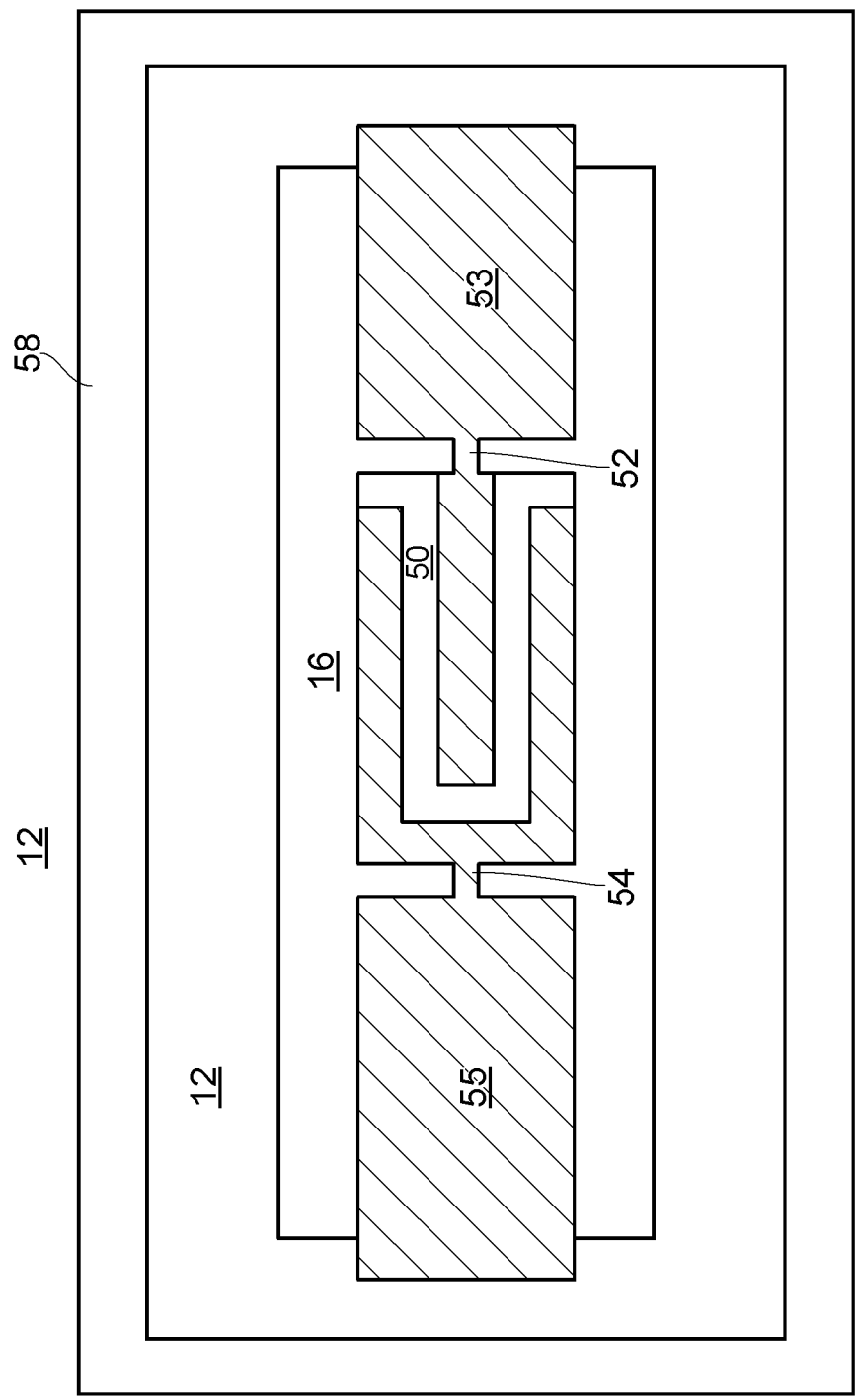

It was noted earlier, with reference to FIG. 1, that the element 14 might be a resonant element held on supports extending above and below the plane of FIG. 1. An embodiment of such a resonant element 48 is schematically illustrated in FIGS. 5a and 5b. FIG. 5a is perspective view of a resonant element 48 comprising a platform 50 having anchors 52 and 54 at opposing ends thereof which extend from the platform to connect with the remainder of the substrate 12, or to connect with cantilevered support elements 53 and 55 as shown in FIG. 5b which then connect to the substrate 12. The illustrated platform 50 has two electrodes 60 and 62 formed on its surface. In this example, a first electrode 60 is formed as an elongate element centrally disposed within a U-shaped second electrode 62. The first electrode 60 has a conduction path extending over the first anchor 52, whereas the second electrode 62 has a conduction path extending over the second anchor 54. Thus, the electrodes 60 and 62 can be driven to form a potential difference between them. The conductive material used to form the electrodes 60 and 62 may be a relatively thin metallic or polysilicon layer. The conductive material extends over the anchors 52 and 54, and over the cantilevered supports 53 and 55 (as indicated by the hatching in FIG. 5b) to bond pads or to vias that extend through some or all of the depth of the substrate to provide electrical connections between the resonant element 48 and other components.

The extent of the recess 16 at an upper surface of the substrate 12 (as discussed with respect to FIG. 1) is also shown in plan view in FIG. 5b. A nominal band region 58 for applying a bonding material between the substrate 12 and the cap 20 is shown in FIG. 5b.

Figure 6:
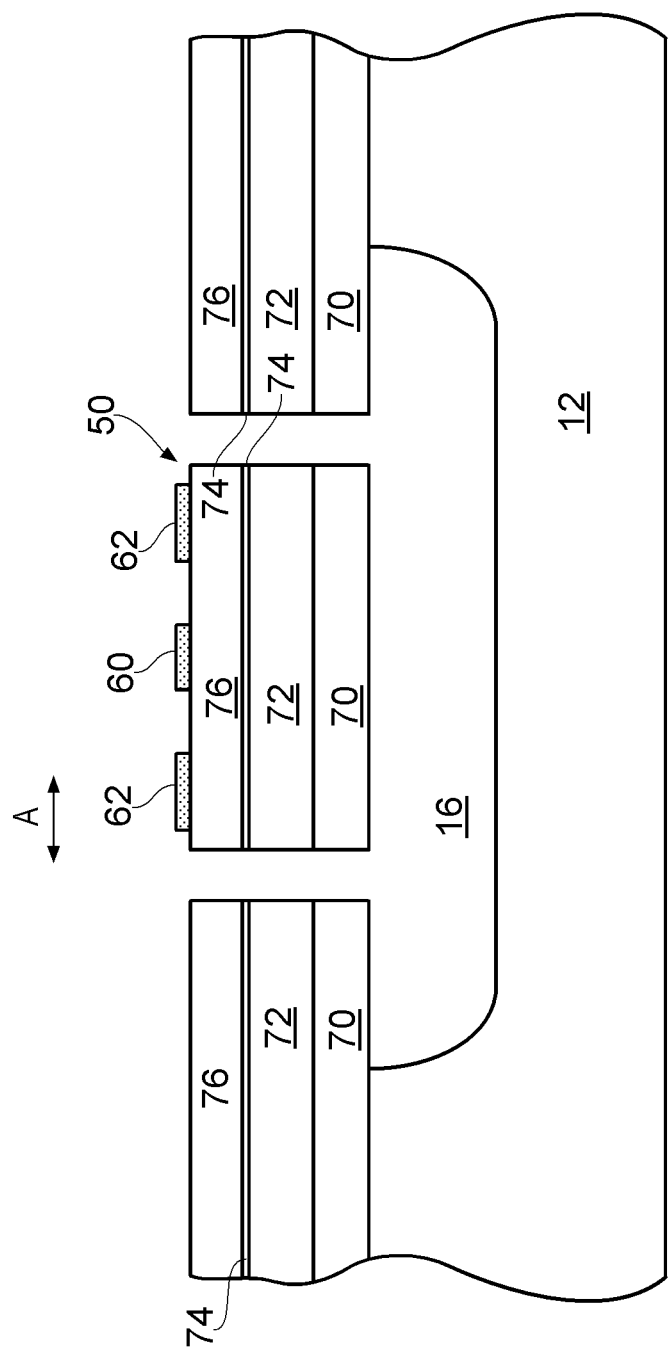
FIG. 6 is a cross section through the resonator of FIGS. 5a and 5b.

FIG. 6 shows an embodiment of the resonant element of FIGS. 5a and 5b in greater detail, together with layers formed at the surface of the substrate 12. FIG. 6 is not drawn to scale. Typically, during processing of the substrate 12, a passivation layer, such as an oxide layer 70, typically one micron thick or so, is formed over the surface of the substrate 12 to protect it and any components formed therein. Then, for convenience, a layer of silicon can be formed over the oxide 70 so as to provide the material which can give the platform 50 structural rigidity. The layer of silicon, designated 72, is relatively thick. Thus the silicon layer 72 may be around 10 microns thick or more, and may be suitably doped. For example, varying the doping can be used to modify the temperature coefficient of the structure, thereby modifying its frequency stability with respect to temperature.

The silicon layer 72 may then be covered by relatively thin metallic layer 74, such as a layer of titanium or other suitable metal having a thickness of approximately 0.1 microns. An aluminum nitride layer 76 can be deposited over the titanium layer 74. The metal electrodes 60 and 62 may be formed by depositing and patterning a mask to reveal apertures where the electrodes 60 and 62 are to be positioned, and then depositing metal such as aluminum or copper or a mixture thereof on to the aluminum (also known as aluminium) nitride layer 76. The masking material can then be etched away.

In a subsequent processing step, a further mask may be applied and patterned in order to expose and etch a channel around the platform 50. The channel may then be etched through the layers 76, 74, 72 and 70 so as to reach the bulk material of the substrate 12. The exposed layers at the edges of the channel may then be protected by a firmly deposited silicon oxide layer before a further etch is performed in order to remove silicon from the substrate 12 beneath the platform 50 so as to leave it suspended over a recess 16. The platform 50 may typically have a length in the order of 150 to 200 microns, and a width of the order of 150 microns. The width of the platform is generally selected to be a function of a wave-length of acoustic waves in silicon (or other material used to form the platform) at the frequency at which it is desired for the resonator to resonate. In this example, the aluminum nitride acts as a piezoelectric material and application of an alternating voltage between the first electrode 60 and the second electrode 62 induces motion along the direction of the arrow A in FIG. 6. Thus, the resonant element should not vibrate out of the plane of the surface of the substrate 12, and hence is not exposed too much to viscous damping even in the presence of an atmosphere within the enclosure. Such a resonant structure may be described as a piezo-on-silicon lamb wave resonator. Such a resonator having dimensions described herein can have a center frequency roughly in the range of 100 MHz, with a temperature stability of better than 200 parts per million over a temperature range of −40° C. to +85° C. Furthermore, in testing Q factors of over 5000 have been achieved.

As noted before, it can be desirable to be able to control the absolute frequency of a component, such as a resonator. This can be achieved by varying the mass of the resonator or by varying the mechanical properties of material forming the resonator, i.e., varying the "spring constant" of the material providing the restoring force. Given that the platform 50 is a composite formed of several layers, then selective removal of parts of the aluminum nitride layer 76 can have the effect of changing the mass of the platform 50. However, selective removal can also change the relative composition of the platform, when viewed as a whole, hence also affecting the spring constant.

During trimming, and as shown in FIG. 4, the platform 50 can be probed in order to determine its resonant frequency.

A laser may then be used to selectively remove some of the aluminum nitride layer 76. This can be achieved by aiming the laser at portions of the exposed aluminum nitride, for example the regions indicated by the "X"s shown in FIG. 5a. The laser may either be fired in a discontinuous manner in order to create a series of pits in the aluminum nitride, or it may be fired in a more continuous manner in order to form a stripe or several stripes in the surface of the aluminum nitride.

In the arrangement shown in FIG. 5a, the electrodes 60 and 62 are formed at nodes of the resonator, and the etching is performed at anti-node positions.

In early stage testing, the resonator of the type shown in FIG. 5a (having a nominal resonant frequency of around 100 MHz) has been trimmable over a frequency range of substantially 1 MHz and components have been trimmed to within an accuracy of ±100 KHz from a nominal center frequency. It is expected that these values can be improved upon.

Because the resonator structure shown in FIG. 5a relies on the formation of standing acoustic waves within the platform 50, it can be used as a filter.

Figure 7:
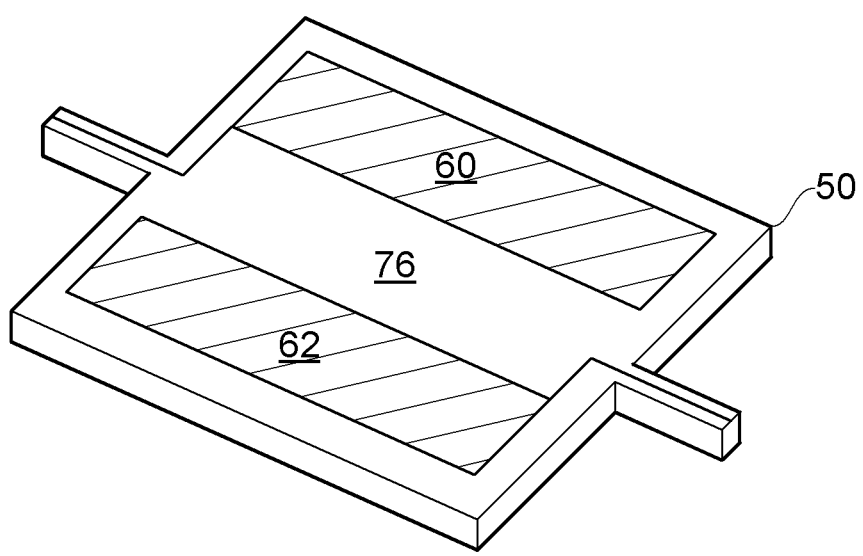
FIG. 7 is a perspective view of a further resonator configuration.

FIG. 7 shows an alternative embodiment of resonator/filter arrangement in which both of the electrodes 60 and 62 are notionally similar elongate strips formed above the piezoelectric material 76 supported on the platform 50. Other electrode patterns and resonator shapes may be used as appropriate. For example, if electrical connection were made to the titanium layer 74 or the silicon layer 72 were highly doped, then acoustic waves running vertically could be excited within the platform 50. This could be instead of or in addition to acoustic waves running horizontally, given the possibility that the same filter element might be constructed to exhibit resonances at different frequencies, but where these resonances tracked one another with, for example, changing temperature. This gives rise to the possibility of using this difference to obtain a very accurate frequency reference.

Indeed, several resonators/filters might be formed within the same integrated circuit, and they may be trimmed or fabricated to resonate different resonant frequencies such that even if the absolute frequency or one or more of the resonators is not known, the relative frequencies are known and may track together with temperature or other environmental parameters to provide a structure having improved frequency stability.

As noted before, the principles and advantages of present disclosure are not limited to the formation of resonant or filter structures of the type described with respect of FIGS. 5a, 5b, 6 and 7, but may also be applied to resistors such as Si—Cr resistors which may be laser trimmed or electrically trimmed. Such resistors may be included in voltage or current sources in order to provide a desired accuracy, or may be provided as termination resistors for transmission lines or the like where accurately setting the resistance of the termination resistor can be significant for avoiding reflection of signals back along the transmission line.

Other MEMS components may also be trimmed. For example, solid state gyroscopes often involve relatively complex structures which are forced into rotational motion or vibration. However, inaccuracies in the mass distribution for such a structure, for example, due to different rates of etching across the structure or slight misalignment of some of the features of the gyroscope may cause it to exhibit unwanted mechanical motion. Such unwanted artifacts may be correctable by selective laser removal of mass from various portions of the gyroscope. Such removal of mass can redistribute the center of mass around the gyroscope, and can be thought as being similar to adding balancing weights to a wheel to make it rotate more smoothly.

Where the piezoelectric material, such as aluminum nitride, is deposited as a relatively thin film, then the possibility for reflection from the material beneath the film can arise. This, in turn, can give rise to the formation of standing wave patterns within the laser light, which may make the trimming process less reliable because it would no longer be possible to accurately predict the amount of energy being delivered to the piezoelectric layer. If this is of concern, then a surface of the cap may be patterned with regularly spaced depressions having a depth corresponding to approximately one quarter of the wavelength of the laser light so as to interrupt any standing wave patterns, and more particularly to ensure that if one portion of the piezoelectric layer was accidentally situated at an antinode, then an adjacent portion would be situated at a node, and these portions are separated by a spatial extent which is less than the beam diameter of the laser, and better still less than half the beam diameter of the laser.

Figure 8:
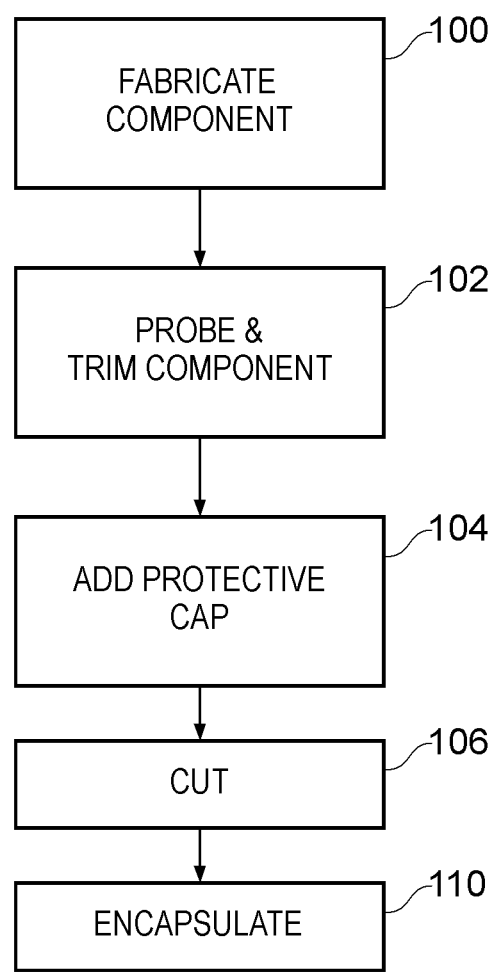
FIG. 8 is a flow chart illustrating a prior art process for the manufacture, trimming and packaging of components.

FIG. 8 is a flow chart of a prior art trimming and encapsulation process. In the prior art process, a wafer is processed via several known fabrication steps to create one or more components in it, of which one is a component which requires trimming. As part of this process, various transistors may be formed and interconnected by metallic layers and then subsequently covered with a layer of passivation. The metallic layers may come up to a connection layer at the upper surface of the substrate, or may be connected to a lower surface of the substrate by way of vias through the silicon. In such an arrangement, no guard areas need to be left around in each individual cap for the purposes of bonding.

After forming the component at operation 100, the process goes to a probe and trim stage where electrical or physical parameters of the component which is to be trimmed are measured, and then the component is trimmed by laser trimming. This may be an iterative process of several measurements and trim cycles until the component reaches a desired value. From then processing passes to operation 104 where one or more protective caps are added over the various individual components formed in the wafer. From operation 104 the silicon wafer is cut or diced at operation 106 to release each individual silicon circuit and its associated cap, and then the individual circuits are packaged at operation 110, for example, in plastic packaging in order to provide a finished product. Thus, any oxidation, contamination, or stress change at operations 104, 106 or 110 can cause the trimmed component to deviate its trimmed value.

Figure 9:
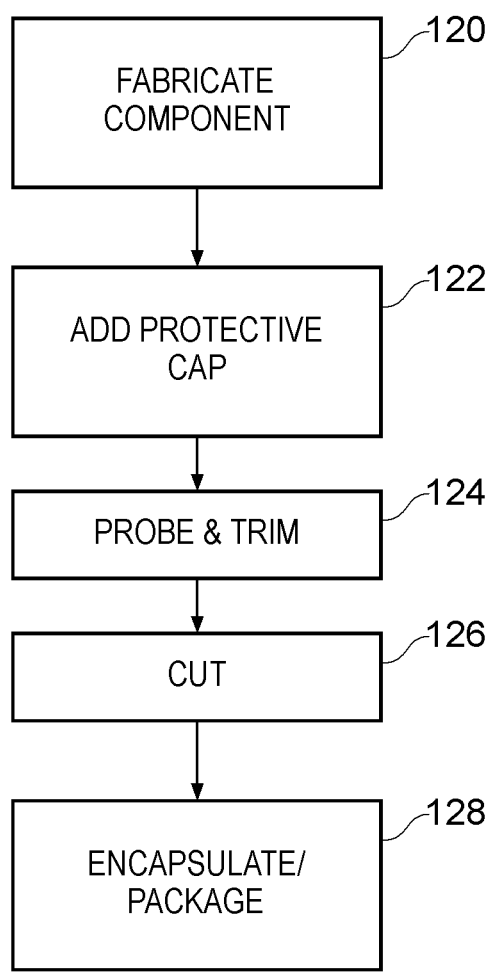
FIG. 9 shows a process in accordance with an embodiment of this disclosure.

With reference to FIG. 9, by contrast, a process in accordance with an embodiment of this disclosure fabricates the component at operation 120, and then proceeds to adding a protective cap at operation 122. Following bonding of the cap to the silicon substrate (or to structures extending from the surface of the substrate), the process moves to operation 124 where each one of the trimmable components is probed and trimmed. This process may be an iterative process. Following trimming, the process flow moves to operation 126 where the wafer is cut, also known as dicing, to release the individual integrated circuits, and these are then packaged at operation 128. Packaging at operation 128 can include encapsulation with molding material, or can involve cavity packaging with a separate packaging substrate (e.g., PCB, molded lead frame, ceramic substrate, etc.) and lid or cap, which would create an additional cavity around the capped and trimmed part. In this process flow, the cap that was added at operation 122 serves to protect the component from oxidation and contamination, and also serves to provide mechanical strength to the wafer or substrate during the cutting and encapsulating operations.

Figure 10:
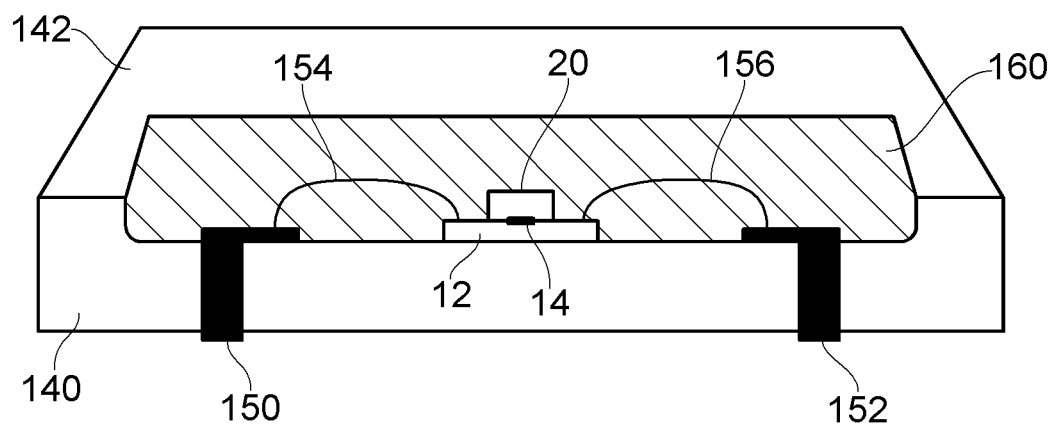
FIG. 10 illustrates a semiconductor component inside an integrated circuit package.

A packaged component is shown in FIG. 10. Here an integrated circuit having a trimmable component 14 held in a protective volume defined by a substrate 12 and a cap 20 is mounted in a package comprising a base portion 140 and a cooperating upper portion 142 that are bonded together. The circuit on the substrate is connected by way of thin wires 154 and 156 to conductive elements 150 and 152 that extend through the base portion 140 to facilitate making electrical connections to a circuit board, for example by way of bump contacts. The interior of the package is sealed by filling it with a mold compound 160. This process may place stresses on the die 12 which, in the absence of the cap 20 providing structural rigidity to the die, may cause resonant components to change their frequency.

It is thus possible to provide an improved process for trimming such a wafer or component thereon, and to a wafer having a component trimmed in accordance with the teachings herein.

Given that the component is trimmed within a controlled atmosphere established within the cavity formed by the cap, it may be possible to identify components trimmed in accordance with this disclosure by virtue of the lack of oxidation occurring at the trim sites. The trim sites can be identified by virtue of being under the transparent cap. Generally, the trim sites also exhibit scores or pits in their surface resulting from the laser initiated ablation of material from the surface of the component. Thus, products formed by the methods disclosed herein can be distinguished from products where the trimming was performed according to the prior art methods.

In testing, trimming was found to be successful with laser pulses at a wavelength of 350 nanometers (ultraviolet) delivering pulses of between 50 nano-joules and 350 nano-joules with a spot size of 10 microns. This showed a controllable change in the amount of material removed, i.e., ablated from the aluminum nitride demonstrating that extreme precision can be achieved. Other wavelengths can be used as known to the person skilled in the art.

Materials other than aluminum nitride may be used in piezoelectric resonators.

It is thus possible to provide an improved method of trimming a component, and as such an improved component. The claims have been presented in single dependency format suitable for filing with the United States Patent Office. However, for the avoidance of doubt it should be understood that each claim may depend on any preceding claim of the same type unless such a combination is clearly technically infeasible.

The systems, apparatus, and/or methods discussed herein can be implemented in various electronic devices. Examples of the electronic devices can include, but are not limited to, consumer electronic products, parts of the consumer electronic products, electronic test equipment, wireless communications infrastructure, etc. Examples of the electronic devices can also include circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the circuits described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and circuits described herein may be embodied in a variety of other forms. Furthermore, various omissions, substitutions and changes in the form of the methods and circuits described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A method of trimming a component formed on a substrate, the method comprising:
   securing a transparent cover to the substrate so as to provide a protected volume around the component prior to dicing a wafer that includes the component, the transparent cover having a surface patterned with regularly spaced depressions; and
   trimming the component to adjust a parameter of the component, wherein the trimming comprises applying light through the surface of the transparent cover to the component.

2. A method as claimed in claim 1, in which the trimming comprises adjusting at least one of a mass of the component or a mass distribution of the component.

3. A method as claimed in claim 1, in which the trimming comprises laser trimming.

4. A method as claimed in claim 1, in which the trimming comprises laser trimming, and the laser trimming is performed prior to the dicing the wafer.

5. A method as claimed in claim 1, in which the component is a microelectrical mechanical systems (MEMS) resonator.

6. A method as claimed in claim 1, in which the component is an accelerometer or a gyroscope, and the trimming modifies a mass or a mass distribution of the component.

7. A method as claimed in claim 1, in which the component is a filter and the trimming adjusts a center frequency of the filter.

8. A method as claimed in claim 1, in which the component is a microelectrical mechanical systems component.

9. A method as claimed in claim 1, where the securing comprises bonding the transparent cover to the substrate or to structures extending from a surface of the substrate.

10. A microelectronic circuit comprising at least a first component formed on a substrate, wherein the first component has a parameter that varies as a function of a fabrication process changes used in the formation of the microelectronic circuit, wherein the microelectronic circuit comprises a laser-transparent cover secured to the substrate so as to form a hermetically sealed enclosure around the first component, the laser-transparent cover having a surface patterned with regularly spaced depressions, wherein the first component comprises a microelectrical mechanical systems (MEMS) component that includes piezoelectric layer, and wherein a trim site of the first component lacks oxidation.

11. A microelectronic circuit formed by a process that comprises laser trimming a microelectrical mechanical systems (MEMS) component formed on a substrate while the MEMS component is within a sealed enclosure formed at least partly by a laser-transparent material coupled to the substrate prior to dicing a wafer that includes the MEMS component, the laser-transparent material having a surface patterned with regularly spaced depressions, wherein the MEMS component has a parameter that varies as a function of a fabrication process changes used in the formation of the microelectronic circuit.

12. A microelectronic circuit as claimed in claim 11, wherein the MEMS component comprises a lamb wave resonator.

13. A microelectronic circuit as claimed in claim 11, wherein the component comprises an aluminum nitride layer.

14. A microelectronic circuit as claimed in claim 11, wherein the laser-transparent material is glass.

15. A method as claimed in claim 5, wherein laser trimming comprises varying at least one of a mass of a platform of the MEMS resonator or a mass of a piezoelectric layer of the MEMS resonator.

16. A method as claimed in claim 5, wherein the MEMS resonator comprises a piezo-on-silicon lamb wave resonator.

17. A microelectronic circuit in claim 10, wherein the laser-transparent cover comprises a recess.

18. A microelectronic circuit in claim 10, wherein the MEMS component comprises a lamb wave resonator.

19. A method as claimed in claim 1, further comprising interrupting a standing wave pattern with the regularly spaced depressions during the trimming.

20. A method as claimed in claim 1, wherein the regularly spaced depressions have a depth corresponding to approximately one quarter of a wavelength of the light.

21. A microelectronic circuit as claimed in claim 11, wherein the regularly spaced depressions are configured to interrupt a standing wave pattern within laser light for the laser trimming.

* * * * *